(12) United States Patent
Evans et al.

(10) Patent No.: US 6,178,134 B1
(45) Date of Patent: Jan. 23, 2001

(54) STATIC RANDOM ACCESS MEMORY WITH GLOBAL BIT-LINES

(75) Inventors: Donald A. Evans, Lancaster, OH (US); Ronald J. Wozniak, Allentown, PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/401,032

(22) Filed: Sep. 21, 1999

(51) Int. Cl.[7] .................................................. G11C 8/00
(52) U.S. Cl. ................................. 365/230.03; 365/208
(58) Field of Search ........................ 365/230.03, 208, 365/63, 190, 196, 185.013

(56) References Cited

U.S. PATENT DOCUMENTS

| | | | |
|---|---|---|---|
| 5,570,319 | * 10/1996 | Santoro et al. | 365/230.03 |
| 5,917,745 | * 6/1999 | Fujii | 365/63 |
| 5,991,217 | * 11/1999 | Tavrow et al. | 365/208 |

* cited by examiner

*Primary Examiner*—David Nelms
*Assistant Examiner*—David Lam
(74) *Attorney, Agent, or Firm*—Steve Mendelsohn

(57) ABSTRACT

The present invention is directed to an SRAM cell layout having a compact architecture and short local bit-lines. The SRAM cell layout has an improved aspect ratio wherein the vertical dimension of the cell is reduced relative to the horizontal dimension of the cell. The resulting additional horizontal space permits the use of an additional vertical metal channel. The SRAM cell layout uses this additional vertical metal channel to add one or more global bit-lines. With the addition of global bit-lines, the communications between SRAM cells on a SRAM device is not limited to conventional one pair of vertical bit-lines. Therefore, the conventional vertical bit-lines may be segmented into shorter local bit-lines. These local bit-lines have shorter length and have reduced capacitance and resistance. The reduced capacitance and resistance in turn improve the performance of the SRAM device.

24 Claims, 8 Drawing Sheets

STATIC RANDOM ACCESS MEMORY WITH GLOBAL BIT-LINES

BACKGROUND OF THE INVENTION

1. Field of the Invention

The present invention relates in general to computer hardware, and, more particularly, to a static random access memory (SRAM).

2. Description of Related Art

FIG. 1 shows a schematic diagram of the layout of a prior art SRAM device 100. SRAM device 100 consists of two cell arrays 101. Each array 101 comprises 32 columns and 512 rows of SRAM cells 102. For each column of cells in each cell array, SRAM device 100 also has a set of column support circuitry 104 which is stacked immediate below the cell array. Analogously, for each row of cells in each cell array, SRAM device 100 has a set of row support circuitry 106. Those skilled in the art will understand that the row and column support circuitry include word-line drivers, address latches, decoders, sense amps, data input latches, data output latches, write drivers, and other components needed to access the array of cells.

FIG. 1A is a schematic diagram of the architecture of each SRAM cell 102 of FIG. 1. As shown in FIG. 1A, each SRAM cell 102 comprises six transistors: two cross-coupled inverters 150 and 155 as a latch element and two access transistors 142, 144 for reading and writing. Word-line 105 travels horizontally controlling N-channel access transistors 142 and 144. N-channel transistors 142 and 144 connect the interior or latch portion of the SRAM cell 102 to a vertical bit-line true 110 and a vertical bit-line complement 115 respectively. Bit-lines 110 and 115 facilitate communication between various SRAM cells 102 of SRAM device 100. Word-line 105 runs horizontally across each row of SRAM cells 102 and facilitates communication between SRAM device 100 and external devices.

Data bits are written into individual SRAM cells 102 of a word in parallel, by activating word-line 105 corresponding to the appropriate row and pulsing appropriate bit-lines 110 or 115. Pulsing bitline 110 stores a 1 in the corresponding cell, while pulsing bit-line 115 stores a 0. Similarly data bits are read from individual SRAM cells 102 in a word in parallel, by activating word-line 105 corresponding to the appropriate row. Each cell in that row will then drive either bit-line 110 or bit-line 115 depending on the value stored in SRAM cell 102. If the stored bit value is 1, then SRAM cell 102 will drive bit-line 110, otherwise SRAM cell 102 will drive bit-line 115 indicating a stored bit value of 0.

SRAM cell 102 further comprises two cross-coupled inverters 150 and 155. Inverter 150 comprises a P-channel transistor 151 and an N-channel transistor 153. Inverter 155 comprises a P-channel channel transistor 156 and an N-channel transistor 158. The two cross-coupling nodes are node 123 and node 125. Node 123 connects N-channel transistor 142 with the common node of inverter 150 and the gate node of inverter 155. The other cross-coupling node 125 connects N-channel transistor 144 with the common node of inverter 155 and the gate node of inverter 150.

One conventional layout 200 used for SRAM cell 102 is illustrated in FIG. 2 in which four mesas 232, 234, 236, and 238 contain P-channel transistors P1 (151 in FIG. 1) and P2 (156), and N-channel transistors N1 (142), N2 (153), N3 (158), and N4 (144). Mesa 232 comprises N1 and N2, mesa 234 comprises N3 and N4, mesa 236 comprises P1, and mesa 238 comprises P2. The two cross-coupling nodes are also illustrated with the same reference numerals 123 and 125 as in FIG. 1. In FIG. 2, node 123 is for the contact portion and 123-1 and 123-2 for the subsidiary portions. Similar notation is used for the node 125.

In the layout of FIG. 2 since the transistors of the same polarity are on the same mesa, there is no problem with interference from the dopants used to form the transistors.

However, prior art SRAM cell layout 200 as shown in FIG. 2 is very limiting. SRAM cell layout 200 relies on the use of one pair of bit-lines 110, 115. When this layout is utilized in SRAM device 100 (of FIG. 1), bit-lines 110, 115 run vertically on one metal level, e.g., metal-2 level, and previously described word-line 105 runs on another metal level, e.g., metal-3 level. One word-line is required for each row of a cell array, and a pair of bit-lines are required for each column of a cell array. Irrespective of the column height, the same pair of bit-lines run vertically from the bottom of each array 101 to the top covering the full array height of 512 cells. These bit-lines are long in length resulting in high bit-line capacitance and resistance.

Another problem with conventional SRAM device 100 relates to bit-line loading. Each bit-line in SRAM device 100 has capacitance and resistance which adds delay in reading and writing data bits from and to the individual cells. The long bit-lines have increased capacitance and resistance which in turn decrease the speed of the data access. In prior art, only one pair of vertical bit-lines is used irrespective of the number of rows in the cell arrays. Thus, when SRAM device 100 has relatively a large number of rows, the long length of the bit-lines results in very high impedance which results in unacceptable low performance.

At the cell level, as shown is the layout 200 of FIG. 2, prior art SRAM cell 102 has an aspect ratio with a long vertical dimension and a short horizontal dimension. This aspect ratio does not allow for any additional vertical metal channels on the same level as the bit-lines.

SUMMARY OF THE INVENTION

The present invention is directed to an SRAM cell layout having a compact architecture and short local bit-lines. The SRAM cell layout has an aspect ratio wherein the vertical dimension of the cell is reduced relative to the horizontal dimension of the cell. The resulting additional horizontal space permits the use of an additional vertical metal channel. The SRAM cell layout enables this additional vertical metal channel to be used for the addition of one or more global bit-lines. These global bit-lines facilitate the communication between various write drivers located on the SRAM device.

In one embodiment, the present invention is an integrated circuit having memory cells, comprising (a) a first array of memory cells arranged in rows and columns; (b) first column support circuitry for the first array; (b) a second array of memory cells arranged in rows and columns; and (d) second column support circuitry for the second array. Each column of the first array is vertically aligned with a corresponding column of the second array. The memory cells in the column of the first and second arrays are connected by a local bit-line, wherein each local bit-line of the first array is distinct from the corresponding local bit-line of the second array. Each column of the first array and the corresponding column of the second array share a global bit-line. Each global bit line is connected (1) to the corresponding local bit-line of the first array by the first column support circuitry and (2) to the corresponding local bit-line of the second array by the second column support circuitry.

In another embodiment, the present invention is an integrated circuit having an SRAM device comprising a plurality of SRAM cells, each SRAM cell having a layout comprising (a) a first vertical mesa disposed in a semi-conductor layer along a first vertical axis, the first vertical mesa corresponding to a first N-channel transistor and a second N-channel transistor; (b) a second vertical mesa disposed in the semi-conductor layer along a second vertical axis parallel to the first vertical axis, the second vertical mesa corresponding to a first P-channel transistor; (c) a third vertical mesa disposed in the semiconductor layer along a third vertical axis parallel to the second vertical axis, the third vertical mesa corresponding to a second P-channel transistor; and (d) a fourth vertical mesa disposed in the semi-conductor layer along a fourth vertical axis parallel to the third vertical axis, the fourth vertical mesa corresponding to a third N-channel transistor and a fourth N-channel transistor.

In yet another embodiment, the present invention is an integrated circuit having an SRAM device comprising a plurality of SRAM cells, each SRAM cell having a layout comprising three parallel channels corresponding to a true local bit-line (BLT), a complement local bit-line (BLC), and a global bit-line, wherein the BLT and the BLC are directly connected to the SRAM cell; and the global bit-line is not directly connected to the SRAM cell.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

The present invention is directed to an SRAM cell layout that enables the addition of a global bit-line to each column in a cell array. In a preferred embodiment, four different global bit-lines—two read global bit-lines (i.e., true and complement) and two write global bit-lines (i.e., true and complement)—are shared by each set of 4 columns in a cell array. These global bit-lines facilitate the communication between various write drivers located on the SRAM device. With the addition of global bit-lines, the communications between SRAM cells on a SRAM device are not limited to the conventional one pair of vertical bit-lines and each cell array of the prior art can be divided into two or more shorter cell arrays aligned vertically. As a result, the conventional vertical bit-lines may be segmented into shorter local bit-lines having shorter length and reduced capacitance and resistance, which in turn improves the performance of the SRAM device.

The SRAM device in accordance with the principles of the present invention may also have a lower power usage. With vertical bit-lines segmented into two or more shorter local bit-lines, the power usage may be reduced by a factor of two or more.

Figure 3:
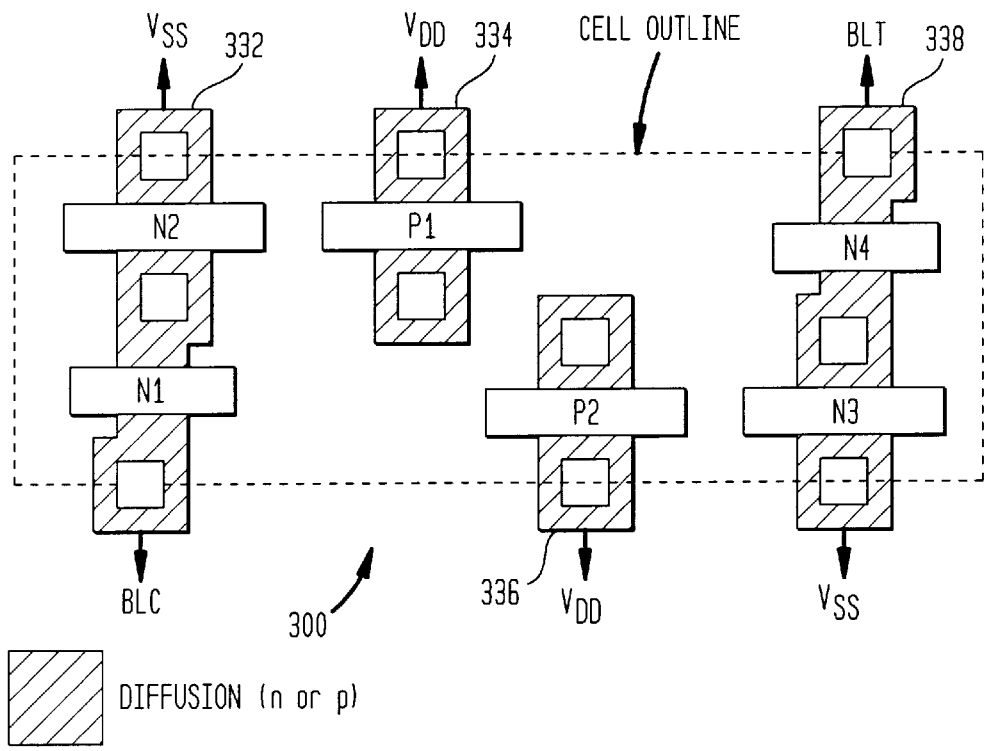
FIG. 3 illustrates a diffusion layer of an SRAM cell layout constructed according to one embodiment of the invention.

Referring now to FIG. 3, there is illustrated a diffusion layer of SRAM cell layout 300 constructed according to one embodiment of the invention. The description of SRAM cell layout 300 is provided in terms of well-known different layers comprising bulk semi-conductor (e.g., silicon) material and technology. The lowest layer is a diffusion layer where active N-channel and P-channel transistor areas are the intersect areas where polysilicon is diffused/inmixed. The next (i.e., top) layers include a polysilicon layer, a metal-1 level, a metal-2 level, and a metal-3 level. N-channel and P-channel vertical mesas are created at the diffusion layer as doped active transistor areas. The local bit-lines exist at the metal-2 level and the word-line exists at the metal-3 level. The local bit-lines are used for communication within the SRAM cell and the word-line is used for communication with devices external to the SRAM cell (e.g., other SRAM cells). As described in detail later, SRAM cell layout 300 also comprises a global bit-line which was not available in the prior art. This global bit-line improves the performance and reduces the power usage.

In FIG. 3, SRAM cell layout 300, at the diffusion layer, comprises four vertical mesas 332, 334, 336, and 338. Vertical mesas 332, 334, 336, and 338 are created at the diffusion layer as active N-channel or P-channel diffusion areas. Vertical mesa 332 comprises two N-channel transistors N1 and N2. Adjacent to vertical mesa 332 (in the horizontal direction) is vertical mesa 334 which comprises a P-channel transistor P1. Adjacent to vertical mesa 334 is vertical mesa 336 which comprises another P-channel transistor P2. Adjacent to vertical mesa 336 is vertical mesa 338 which comprises two N-channel transistors N3 and N4. Vertical mesas 334 and 336 are P-channel diffusion areas. Vertical mesas 332 and 338 are N-channel diffusion areas.

Vertical mesa 332, at its top end and its bottom end, is connected to a ground end of reference voltage source $V_{SS}$ and to a complement bit-line labeled BLC, respectively. Vertical mesa 334, at its top end, is connected to a positive reference voltage source $V_{DD}$. Vertical mesa 336, at its bottom end, is connected to the positive voltage source $V_{DD}$. A true bit-line labeled BLT and the ground end of voltage source $V_{SS}$ are, respectively, connected to the top end and the bottom end of vertical mesa 338.

Figure 4:
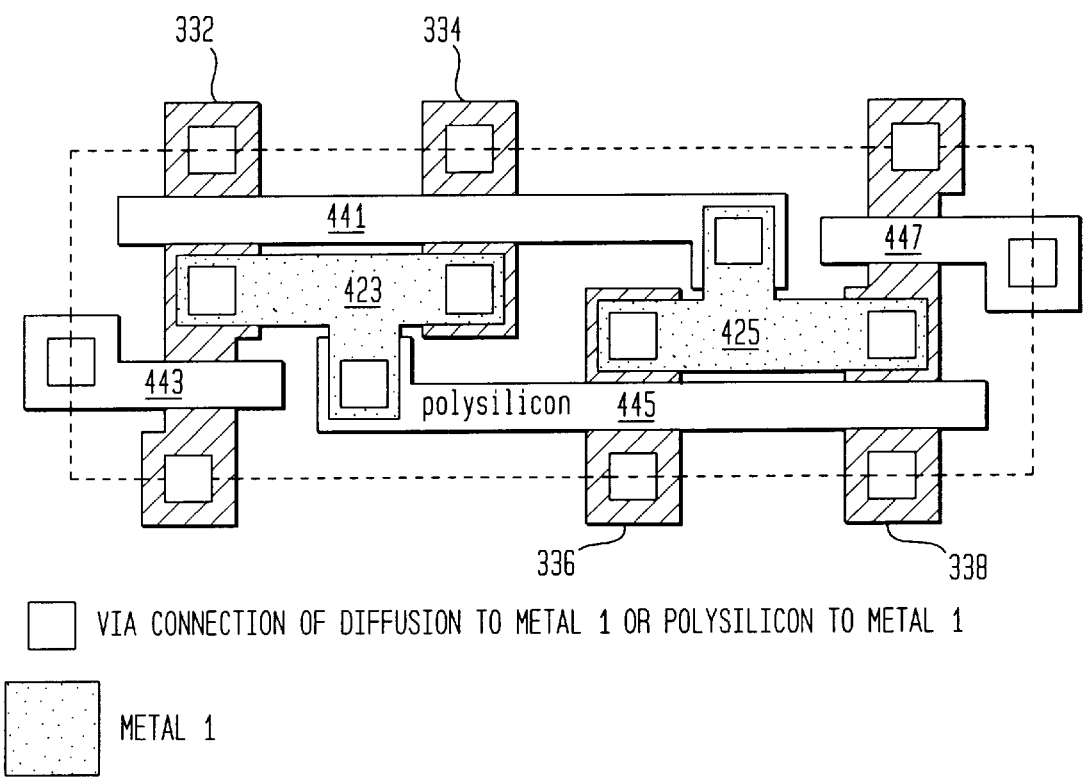
FIG. 4 is another view of the SRAM cell layout illustrating vertical mesas as well as metal-1 interconnects constructed according to one embodiment of the invention.

FIG. 4 is another view of SRAM cell layout 300 wherein the vertical mesas as well as metal-1 interconnects 423 and 425 and polysilicon interconnects 441, 443, 445 and 447 are shown.

In FIG. 4, metal-1 interconnects 423 and 425 are two cross coupling nodes. Metal-1 interconnects 423 and 425 are similar to interconnects 123 and 125 of the prior art. Polysilicon interconnect 441 couples vertical mesas 332 and 334 to metal-1 interconnect 425. Polysilicon interconnect 443 couples vertical mesa 332 to the outer boundary of SRAM cell layout 300. Polysilicon interconnect 445 couples vertical mesa 338 and vertical mesa 336 to metal-1 interconnect 423. Polysilicon interconnect 447 couples vertical mesa 338 to the outer boundary of SRAM cell layout 300.

Figure 5:
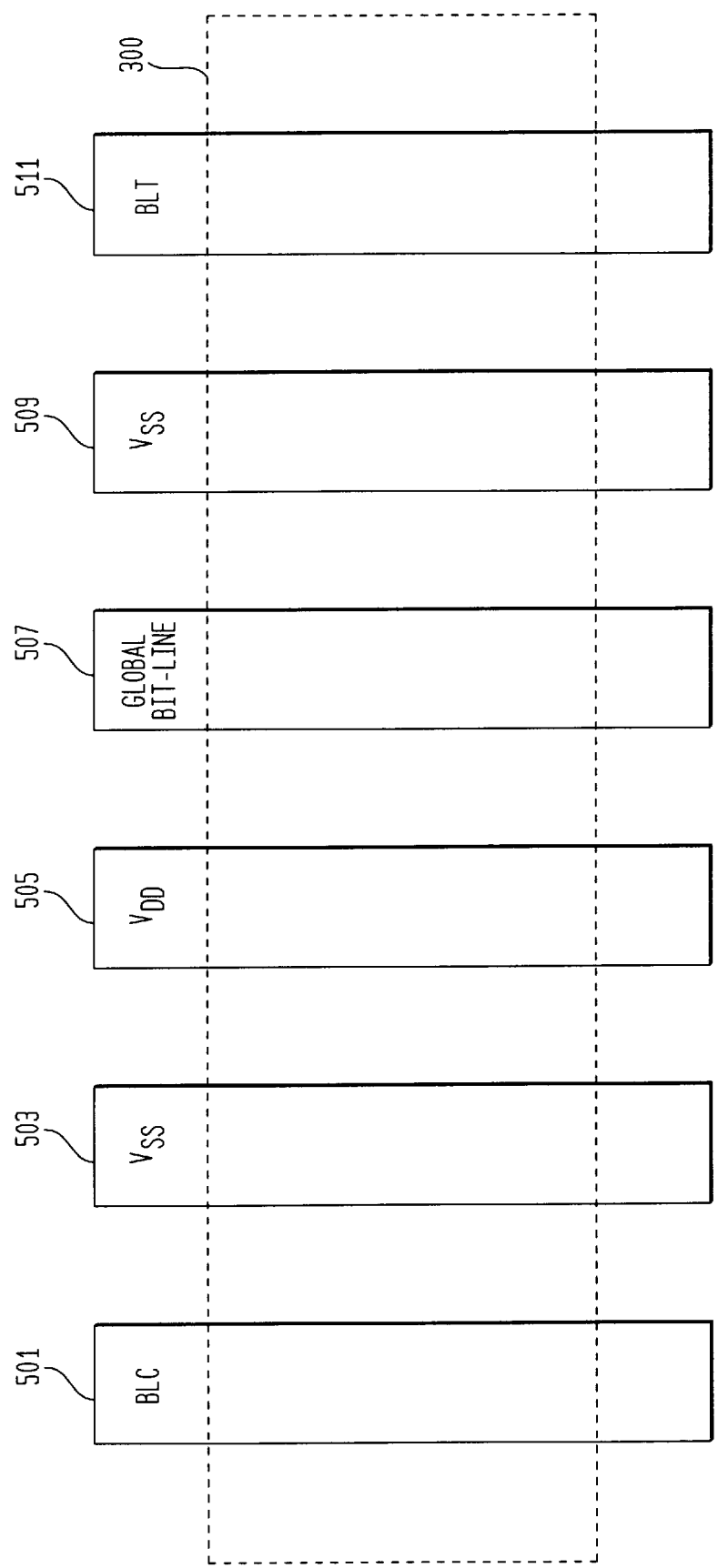
FIG. 5 is another view of the SRAM cell layout constructed according to one embodiment of the invention.

FIG. 5 is another view of SRAM cell layout 300. In FIG. 5, six logical vertical channels 501, 503, 505, 507, 509, and 511 located at the metal-2 level of SRAM cell layout 300 are shown. First logical channel 501 is for the local bit-line complement BLC; second logical channel 503 is for the ground end of voltage source $V_{SS}$; third logical channel 505 is for the positive voltage source $V_{DD}$ (e.g., 3.5 volts or 2 volts); fourth logical channel 507 is for the global bit-line; fifth logical channel 509 is for another ground end of the voltage supply source $V_{SS}$; and sixth logical cell 511 is for the local bit-line true BLT.

As shown in FIG. 5, SRAM cell layout 300 is enlarged in the horizontal direction and shortened in the vertical dimension. The enlarged horizontal dimension of SRAM cell layout 300 permits the addition of vertical channel 507 which was not available in the prior art. In the present invention, vertical channel 507 is preferably used for a global bit-line. As described in detail later, the additional global bit-line allows a faster communication between various SRAM cells and thereby improves the performance of the SRAM device.

Figure 6:
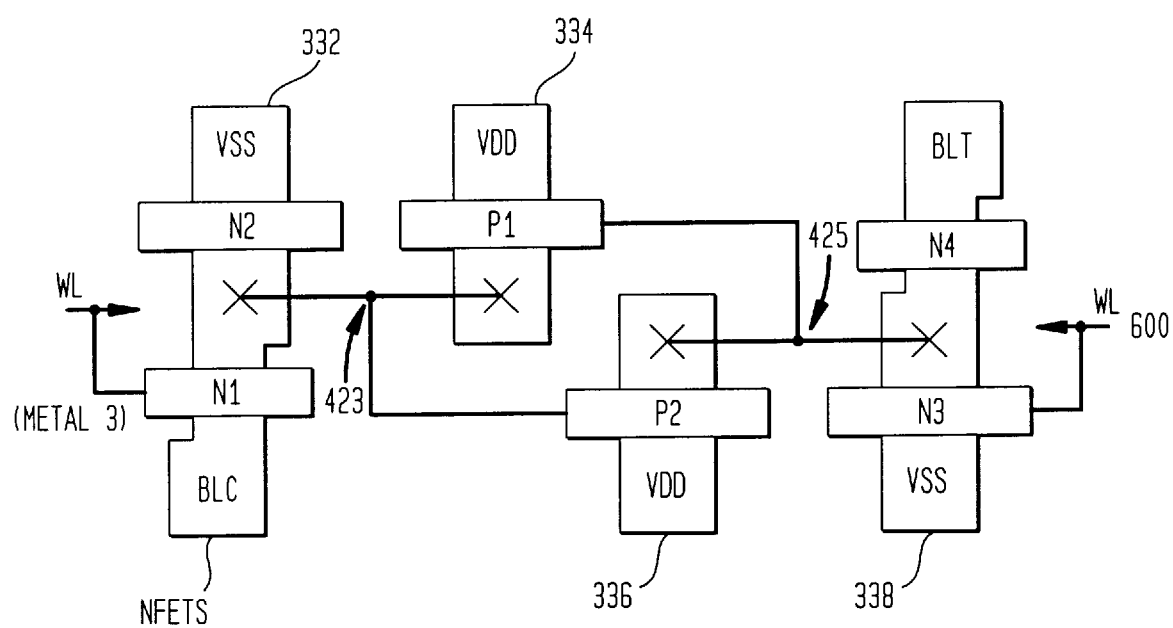
FIG. 6 is another view of the SRAM cell layout illustrating vertical mesas, cross-coupling nodes, and a word-line constructed according to one embodiment of the invention.

FIG. 6 is another view of the SRAM cell layout 300 illustrating vertical mesas 332, 334, 336, and 338, cross-coupling nodes 423, and 425, and a word-line 600. Word-line 600 is located at the metal-3 level, and is connected to the gates of N1 and N3. Word-line 600 facilitates communication between the SRAM cell and devices located external to the SRAM cell.

Figure 7:
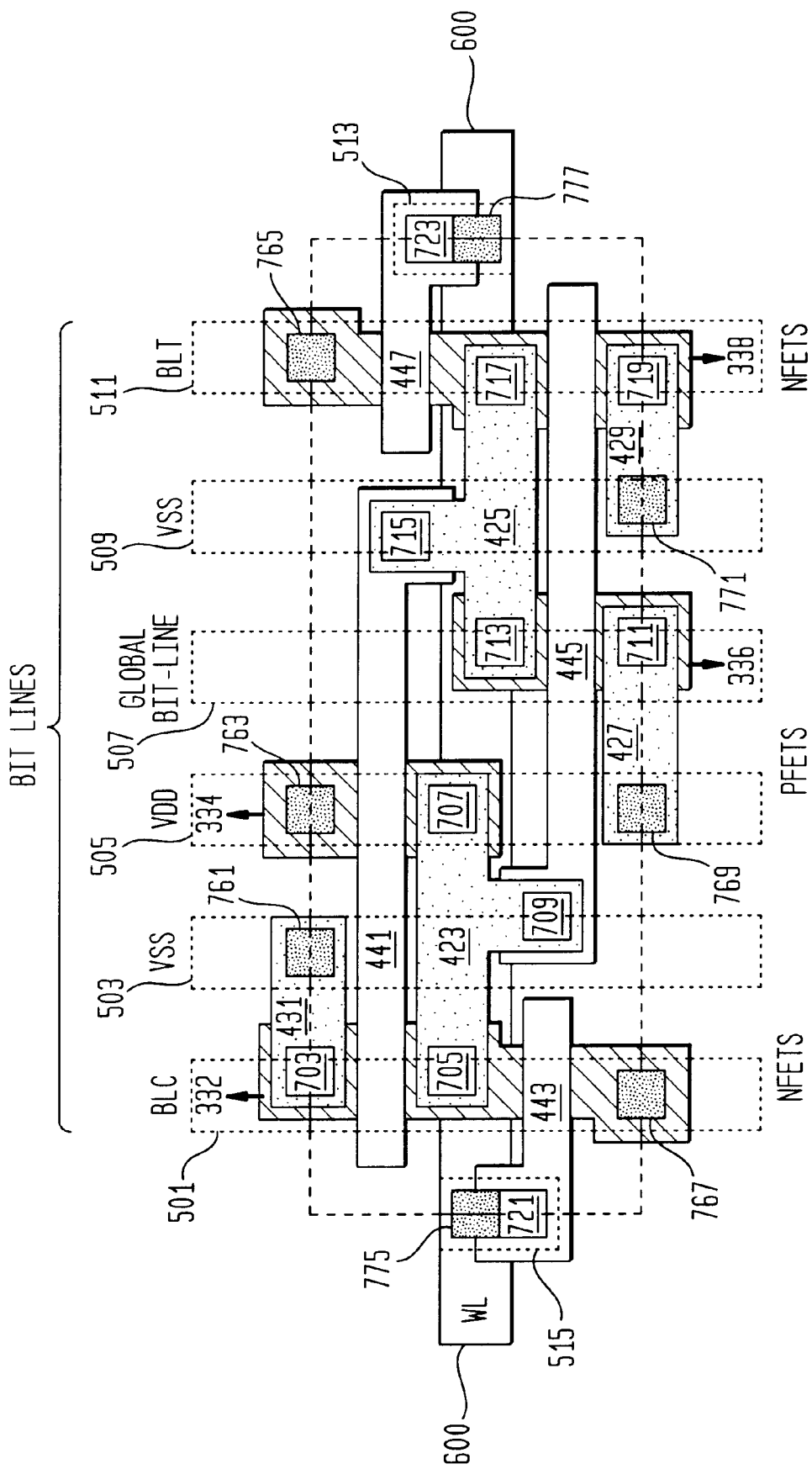
FIG. 7 is a comprehensive view of the SRAM cell layout constructed according to one embodiment of the invention.

FIG. 7 is a comprehensive view of SRAM cell layout 300. At the metal-2 level, in addition to vertical channels 501, 503, 505, 507, 509, and 511, SRAM cell layout 300 has two additional vertical channels 513 and 515, which are respectively located on each vertical outer boundary of SRAM cell layout 300. Vertical channels 513 and 515 help to connect the metal-2 level to word-line 600.

In addition to interconnects 423 and 425, the metal-1 level has three additional interconnects labeled as 427, 429, and 431. Metal-1 interconnect 423 connects vertical mesa 332 and vertical mesa 334 to polysilicon interconnect 445. Metal-1 interconnect 425 connects vertical mesa 336 and vertical mesa 338 to polysilicon interconnect 441. Metal-1 interconnect 427 connects vertical mesa 336 to power-supply $V_{DD}$ vertical channel 505. Metal-1 interconnect 429 connects vertical mesa 338 to power-supply $V_{SS}$ vertical channel 509. Metal-1 interconnect 431 connects vertical mesa 332 to power-supply $V_{SS}$ vertical channel 503.

FIG. 7 also illustrates various connect points (via holes) for connecting elements in different layers together. Connect point 703 connects metal-1 interconnect 431 to vertical mesa 332. Connect point 705 connects metal-1 interconnect 423 to vertical mesa 332. Connect point 707 connects metal-1 interconnect 423 to vertical mesa 334. Connect point 709 connects metal-1 interconnect 423 to polysilicon interconnect 445. Connect point 711 connects metal-1 interconnect 427 to vertical mesa 336. Connect point 713 connects metal-1 interconnect 125 to vertical mesa 336. Connect point 715 connects metal-1 interconnect 425 to polysilicon interconnect 441. Connect point 717 connects metal-1 interconnect 425 to vertical mesa 338. Connect point 719 connects metal-1 interconnect 429 to vertical mesa 338. Connect point 721 connects polysilicon interconnect 443 to vertical channel 515. Connect point 723 connects polysilicon interconnect 447 to vertical channel 513.

Connect point 761 connects metal-1 interconnect 431 to vertical channel 503. Connect point 763 connects vertical mesa 334 to vertical channel 505. Connect point 765 connects vertical mesa 338 to vertical channel 511. Connect point 767 connects vertical mesa 332 to vertical channel 501. Connect point 769 connects metal-1 interconnect 427 to vertical channel 505. Connect point 771 connects interconnect 429 to vertical channel 509. Connect point 775 connects vertical channel 515 to word-line 600. Connect point 777 connects vertical channel 513 to word-line 600.

SRAM cell layout 300 results in improved performance. In SRAM cell layout 300, the horizontal dimension of the cell is enlarged relative to the vertical dimension of the cell, which results in a relatively shorter length of bit-lines BLC 501 and BLT 511. Due to the shorter relative vertical length, the capacitance and resistance of the local bit-lines 501 and 511 are also reduced. The relatively enlarged horizontal dimension permits the use of an additional vertical metal channel 507 on the same level as the local bit-lines (i.e., the metal-2 level). This vertical metal channel is preferably used for a global bit-line.

Figure 1:
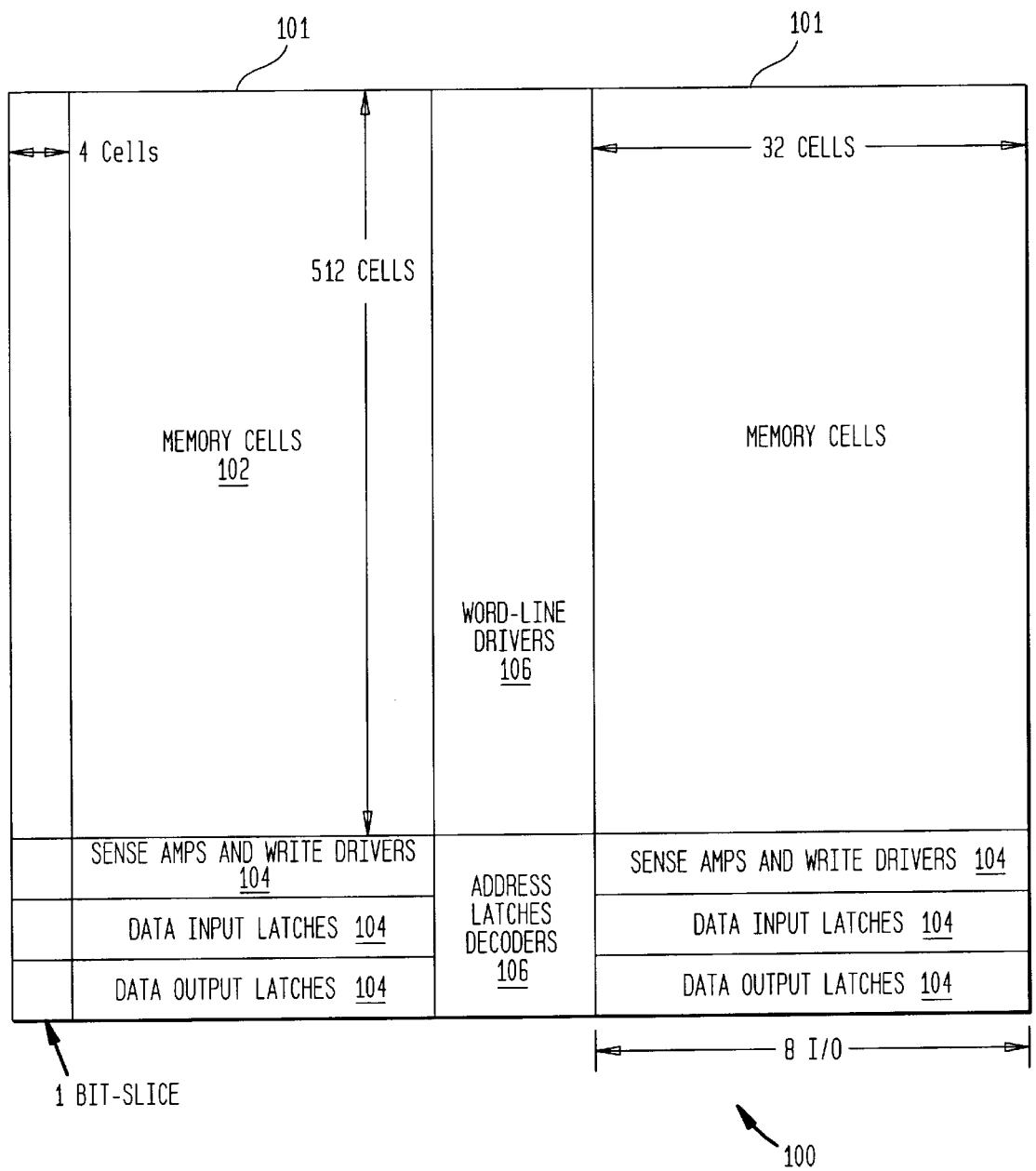
FIG. 1 shows a schematic diagram of the layout of a prior art SRAM device.
Figure 1A:
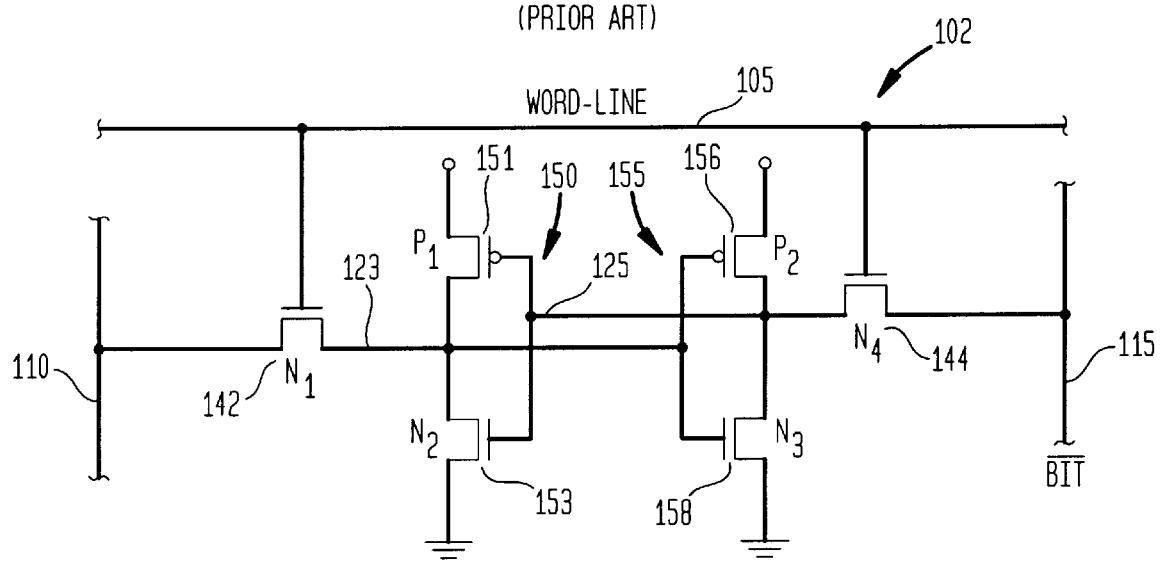
FIG. 1A is a schematic diagram of the architecture of an SRAM cell of FIG. 1.
Figure 2:
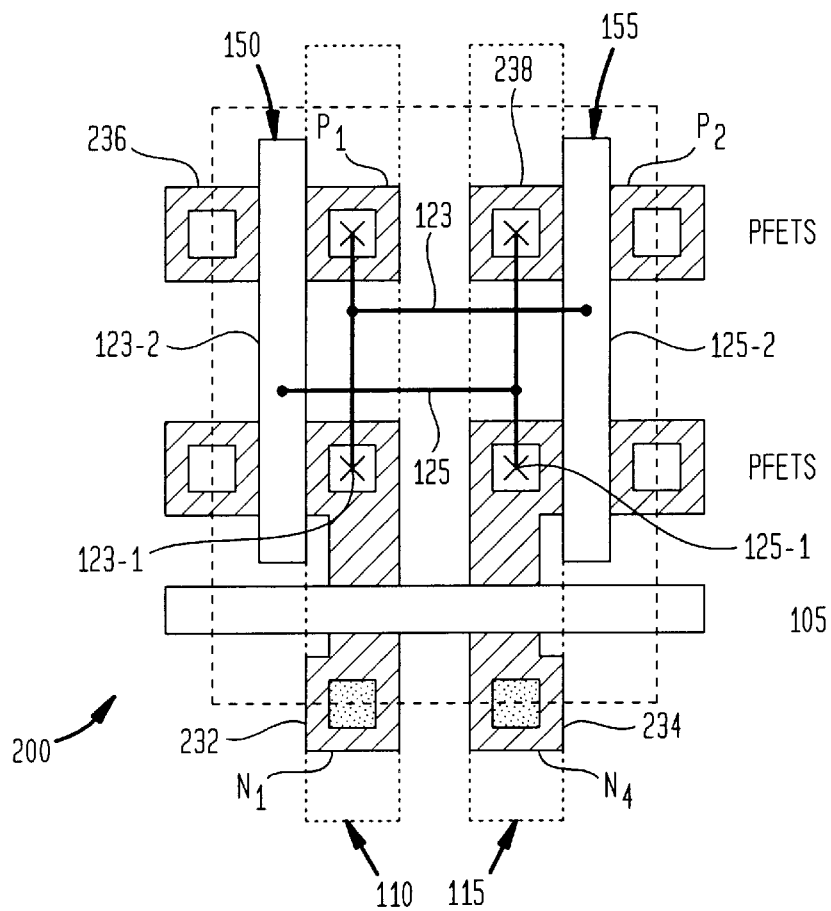
FIG. 2 illustrates a conventional layout used for an SRAM cell of FIG. 1 and FIG. 2.
Figure 8:
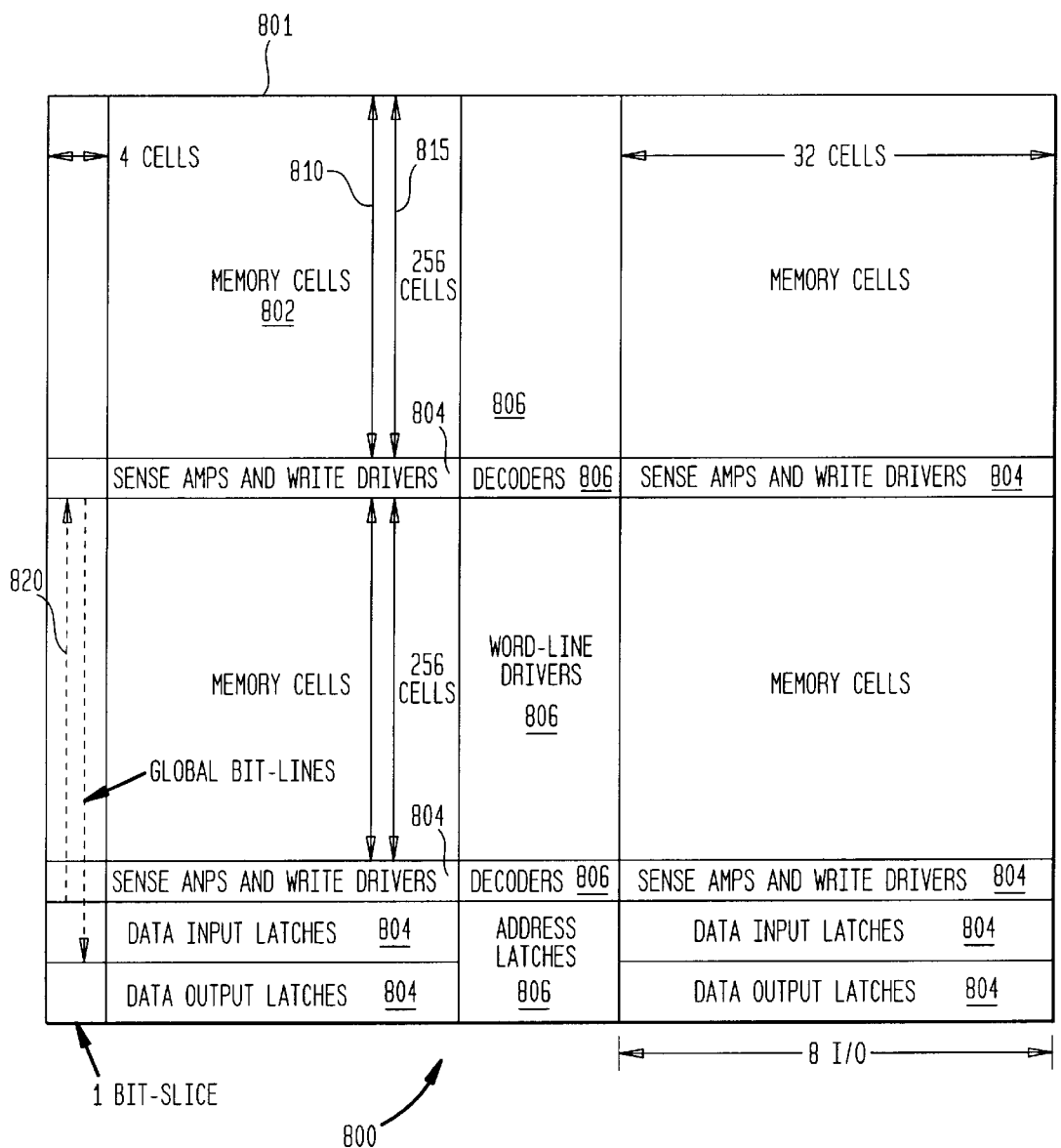
FIG. 8 illustrates a block diagram of an SRAM cell device designed in accordance with one embodiment of the present invention.

By the form of an example, FIG. 8 illustrates a block diagram of an SRAM cell device 800 designed in accordance with one embodiment of the present invention. By the way of comparison to FIG. 1, in FIG. 8, SRAM cell device 800 has four cell arrays 801. Each cell array 801 is 256 cells deep and 32 cells wide. For each column of cells in each cell array 801, SRAM device 800 also has a set of column support circuitry 804 which is stacked immediately below each cell array. Analogously, for each row of cells in array cell 801, SRAM device 800 has row support circuitry 806 which is located horizontally between adjacent cell arrays 801. Those skilled in the art will understand that the column and row support circuitry include sense amps, data input latches, data output latches, word-line drivers, decoders, address latches, write drivers, and other components needed to access the array of cells.

Unlike vertical bit-lines of the prior art, each column of cells in SRAM cell device 800 comprises two local bit-lines 810 and 815. Local bit-lines 810 and 815 travel vertically across each cell array 801 covering 256 SRAM cells 802. Thus, as compared to prior vertical bit-lines, bit-lines of the present invention have been segmented into shorter local bit-lines. Local bit-lines 810 and 815 of the present invention are shorter in length and have reduced capacitance and resistance.

FIG. 8 also illustrates a single global bit-line 820 which travels across each column in cell array 801 in the vertical direction. The number of global bit-lines located within an SRAM cell may also be increased by increasing the number of vertical channels allocated to the global bit-lines. Unlike local bit-lines, global bit-lines 820 are not coupled to individual SRAM cells, and but rather travel directly from one set of column support circuitry 804 to another set of column support circuitry 804. At the cell level, there is no direct connection between the local bit-lines and the global bit-lines which nevertheless pass through the cell layout. Global bit-lines 820 are bidirectional in nature (read and write). During a write cycle, global bit-lines 820 send data in an upward direction to the write-drivers located in column support circuitry 804. The write-drivers then write this data onto the corresponding local bit-line 810 or 815. During a read cycle, sense-amps of column support circuitry 804 sense data on the local bit-lines, buffer the data, and then pass on the data to global bit-lines 820. In both write and read cycles, the local bit-lines of segments not corresponding to the word-line in use are not used and remain in precharge state and therefore do not use any power. Thus, SRAM cell device 800 has reduced power usage. In the exemplary case of FIG. 8, the bit-line power is reduced by a factor of two or more. The improvement in performance (i.e., speed) is about 50 percent.

FIG. 8 illustrates each cell array 801 being 256 cells deep and 32 cells wide, with local bit-lines covering the array height of 256 cells. But, in practice, vertical local bit-lines may be further reduced in length by increasing the number of arrays 801 in the vertical direction.

Figure 9:
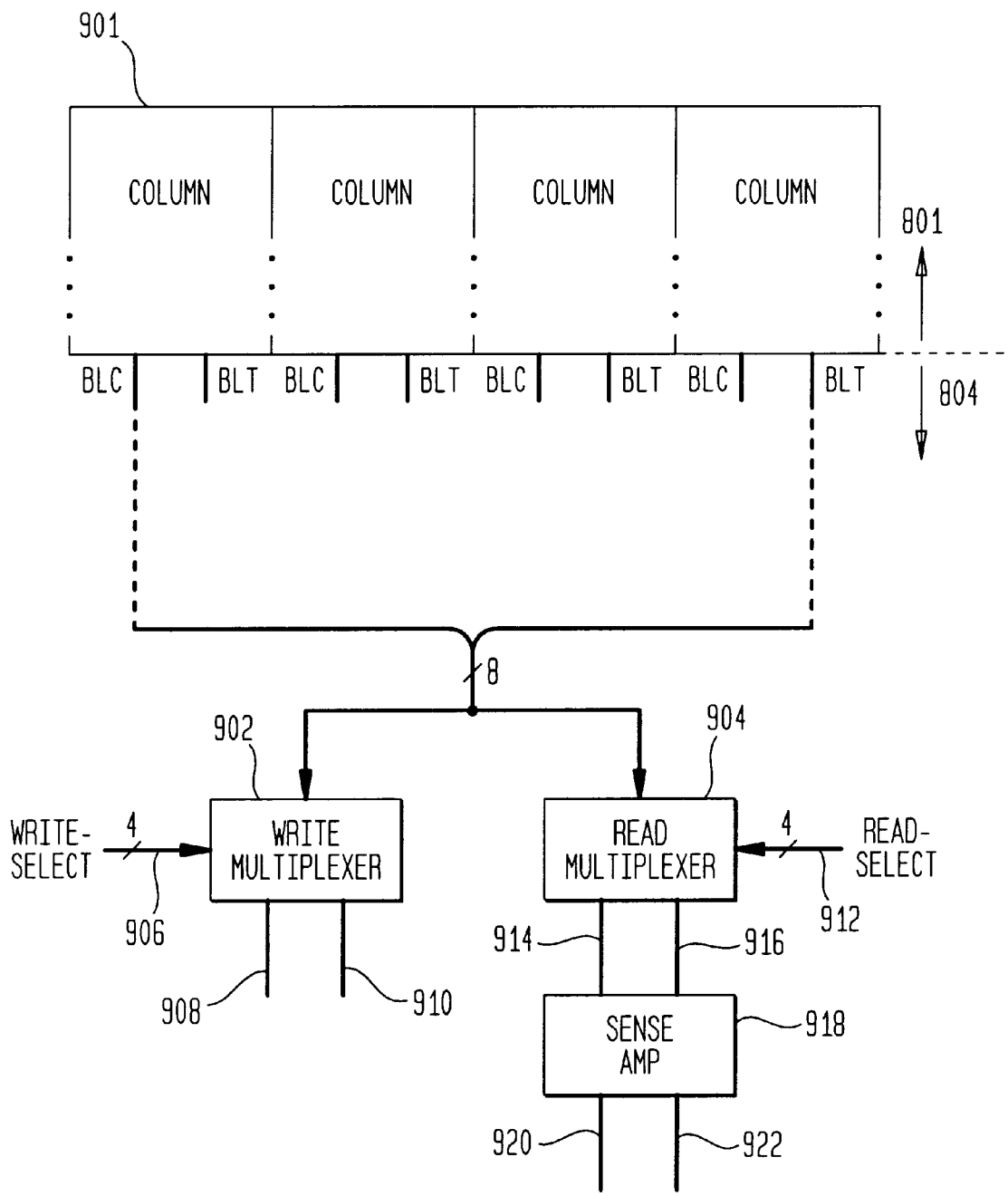
FIG. 9 illustrates an exemplary case having four different global bit-lines for each set of four columns.

FIG. 9 illustrates an exemplary case having four different global bit-lines (908, 910, 920, 922) for each set of four columns 901 of SRAM cells, wherein each column 901 also has two local bit-lines labeled bit-line complement (BLC) and bit-line true (BLT). Thus, in total, there are eight local bit-lines which are coupled to a write multiplexer 902 and a read multiplexer 904. Write and read multiplexers are part of column support circuitry 804 of FIG. 8.

Write multiplexer 902 is coupled to a write-select 906 and two global bit-lines 908 and 910. Global bit-lines 908 and 910 are respectively known as global write data true and global write data complement. Read multiplexer 904 is coupled to a read-select 912 and two bit-lines 914 and 916. Bit-lines 914 and 916 are then coupled to a sense amp 918 which is further coupled to two global bit-lines 920 and 922. Global bit-lines 920 and 922 respectively are known as global read data true and global read data complement.

Thus, for each column of SRAM cells, there corresponds one global bit-line. For four column muxing, there exists four global bit-lines labeled as global write data true, global write data complement, global read data true, and global read data complement. The principles of the present invention are flexible and provide a user flexibility in selecting the number of global bit-lines to be added to the cell layout.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. An integrated circuit having memory cells, comprising:
   (a) a first array of memory cells arranged in rows and columns;
   (b) first column support circuitry for the first array;
   (c) a second array of memory cells arranged in rows and columns; and
   (d) second column support circuitry for the second array, wherein:
   each column of the first array is vertically aligned with a corresponding column of the second array;
   the memory cells in each column of the first and second arrays are connected by a local bit-line, wherein each local bit-line of the first array is distinct from the corresponding local bit-line of the second array;
   each column of the first array and the corresponding column of the second array share a global bit-line;
   each global bit-line is connected (1) to the corresponding local bit-line of the first array by the first column support circuitry and (2) to the corresponding local bit-line of the second array by the second column support circuitry; and
   each memory cell is an SRAM cell having a layout comprising:
      (a) a first vertical mesa disposed in a semi-conductor layer along a first vertical axis, the first vertical mesa corresponding to a first N-channel transistor and a second N-channel transistor;
      (b) a second vertical mesa disposed in the semi-conductor layer along a second vertical axis parallel to the first vertical axis, the second vertical mesa corresponding to a first P-channel transistor;
      (c) a third vertical mesa disposed in the semi-conductor layer along a third vertical axis parallel to the second vertical axis, the third vertical mesa corresponding to a second P-channel transistor; and
      (d) a fourth vertical mesa disposed in the semi-conductor layer along a fourth vertical axis parallel to the third vertical axis, the fourth vertical mesa corresponding to a third N-channel transistor and a fourth N-channel transistor.

2. The invention of claim 1, further comprising:
   (e) one or more additional arrays of memory cells arranged in rows and columns; and
   (f) additional column support circuitry for each additional array, wherein:
   each column of each additional array is vertically aligned with corresponding columns of the first and second arrays;
   the memory cells in each column of each additional array are connected by a local bit-line;
   each column of each additional array shares the corresponding global bit-line with the corresponding columns of the first and second arrays; and
   each global bit-line is connected to the corresponding local bit-line of each additional array by the corresponding additional column support circuitry.

3. The invention of claim 1, wherein:
   each column of memory cells comprises a true local bit-line and complement local bit-line; and
   the true and complement local bit-lines for each column are connected to the corresponding global bit-line by the corresponding column support circuitry.

4. The invention of claim 1, wherein each local bit-line is connected to the corresponding global bit-line via one or more sense amps and one or more write drivers of the corresponding column support circuitry.

5. The invention of claim 1, wherein the layout of each memory cell comprises a true local bit-line (BLT) channel, a complement local bit-line (BLC) channel, and a global bit-line channel located in a single integrated circuit (IC) level.

6. The invention of claim 5, wherein the layout of each memory cell further comprises a power level channel and a ground level channel located in the single IC level.

7. The invention of claim 1, wherein the layout of each memory cell has an aspect ratio that can accommodate a vertical channel within the memory cell layout for the global bit-line.

8. The invention of claim 1, wherein the resistance and capacitance of each local bit-line is less than the resistance and capacitance of a combined bit-line for a memory device having a single cell array corresponding to a combination of the first and second arrays.

9. The invention of claim 1, wherein each local bit-line is drivable faster and with less power than a combined bit-line for a memory device having a single cell array corresponding to a combination of the first and second arrays.

10. The invention of claim 1, wherein each set of four columns in the first array shares a global write data true bit-line, a global write data complement bit-line, a global read data true bit-line, and a global read data complement bit-line.

11. The invention of claim 10, wherein the global write data true bit-line, the global write data complement bit-line, the global read data true bit-line, and the global read data complement bit-line are shared by a corresponding set of four columns in the second array.

12. The invention according to claim 1, wherein:
the first vertical mesa is connected to a first reference voltage;
the second vertical mesa is connected to a second reference voltage;
the third vertical mesa is connected to the second reference voltage; and
the fourth vertical mesa is connected to the first reference voltage.

13. The invention according to claim 1, wherein the SRAM cell layout further comprises three parallel channels corresponding to a true local bit-line (BLT), a complement local bit-line (BLC), and a global bit-line, wherein:
the BLT and the BLC are directly connected to the SRAM cell; and
the global bit-line is not directly connected to the SRAM cell.

14. The invention of claim 13, wherein the SRAM cell layout further comprises three reference voltage channels parallel to the BLT, BLC, and global bit-line channels.

15. The invention of claim 1, wherein each SRAM cell has a layout comprising three parallel channels corresponding to a true local bit-line (BLT), a complement local bit-line (BLC), and a global bit-line, wherein:
the BLT and the BLC are directly connected to the SRAM cell; and
the global bit-line is not directly connected to the SRAM cell.

16. The invention of claim 15, wherein the SRAM cell layout further comprises three reference voltage channels parallel to the BLT, BLC, and global bit-line channels.

17. An integrated circuit having an SRAM device comprising a plurality of SRAM cells, each SRAM cell having a layout comprising:
(a) a first vertical mesa disposed in a semi-conductor layer along a first vertical axis, the first vertical mesa corresponding to a first N-channel transistor and a second N-channel transistor;
(b) a second vertical mesa disposed in the semi-conductor layer along a second vertical axis parallel to the first vertical axis, the second vertical mesa corresponding to a first P-channel transistor;
(c) a third vertical mesa disposed in the semi-conductor layer along a third vertical axis parallel to the second vertical axis, the third vertical mesa corresponding to a second P-channel transistor; and
(d) a fourth vertical mesa disposed in the semi-conductor layer along a fourth vertical axis parallel to the third vertical axis, the fourth vertical mesa corresponding to a third N-channel transistor and a fourth N-channel transistor.

18. The invention according to claim 17, wherein:
the first vertical mesa is connected to a first reference voltage;
the second vertical mesa is connected to a second reference voltage;
the third vertical mesa is connected to the second reference voltage; and
the fourth vertical mesa is connected to the first reference voltage.

19. The invention according to claim 17, wherein the SRAM cell layout further comprises three parallel channels corresponding to a true local bit-line (BLT), a complement local bit-line (BLC), and a global bit-line, wherein:
the BLT and the BLC are directly connected to the SRAM cell; and
the global bit-line is not directly connected to the SRAM cell.

20. The invention of claim 19, wherein the SRAM cell layout further comprises three reference voltage channels parallel to the BLT, BLC, and global bit-line channels.

21. An integrated circuit having an SRAM device comprising a plurality of SRAM cells, each SRAM cell having a layout comprising three parallel channels corresponding to a true local bit-line (BLT), a complement local bit-line (BLC), and a global bit-line, wherein:
the BLT, the BLC, and the global bit-line are all formed on a same metal level of the SRAM cell layout;
the BLT and the BLC are directly connected to the SRAM cell; and
the global bit-line is not directly connected to the SRAM cell.

22. The invention of claim 21, wherein the SRAM cell layout further comprises three reference voltage channels parallel to the BLT, BLC, and global bit-line channels.

23. The invention of claim 22, wherein the BLT, the BLC, the global bit-line, and the three reference voltage channels are all formed on the same metal level of the SRAM cell layout.

24. The invention of claim 21, wherein the SRAM cell further comprises one or more word-lines, wherein all word-lines are formed in metal only on one or more metal levels of the SRAM cell layout different from the metal level of the BLT, the BLC, and the global bit-line.

* * * * *